United States Patent [19]

Wiegand

[11] 4,263,523
[45] Apr. 21, 1981

[54] PULSE GENERATOR USING READ HEAD WITH WIEGAND WIRE

[75] Inventor: John R. Wiegand, Valley Stream, N.Y.

[73] Assignee: The Echlin Manufacturing Company, Branford, Conn.

[21] Appl. No.: 75,887

[22] Filed: Sep. 17, 1979

Related U.S. Application Data

[63] Continuation-in-part of Ser. No. 897,483, Apr. 18, 1978, which is a continuation-in-part of Ser. No. 793,394, May 3, 1977, abandoned.

[51] Int. Cl.³ .................. G11C 11/04; H03K 3/45
[52] U.S. Cl. ................................. 307/419; 365/133
[58] Field of Search .............. 365/133; 307/419; 360/111

[56] References Cited

U.S. PATENT DOCUMENTS

| | | | |
|---|---|---|---|
| 3,602,906 | 8/1971 | Wiegand | 307/419 |
| 3,820,090 | 6/1974 | Wiegand | 365/133 |
| 3,892,118 | 7/1975 | Weigand | 365/133 |

OTHER PUBLICATIONS

Popular Science-"Wiegands Wonderful Wires"; May 1979, pp. 102-104 and 165.

*Primary Examiner*—James W. Moffitt
*Attorney, Agent, or Firm*—McAulay, Fields, Fisher, Goldstein & Nissen

[57] ABSTRACT

A read head for a Wiegand type wire establishes an asymmetric field to which the wire is subjected. A setting magnet at a first position establishes a sufficiently strong positive field to set the core and shell of the Wiegand wire in a first confluent state. At a second position, the field is sufficiently negative so as to assure that the core switches state thereby establishing a reverse state for the wire. The field does not go strongly negative and thus the state of the shell is not reversed. At a third position, the field becomes sufficiently positive so as to cause the core to reverse its state again thereby switching the wire from its reverse state to its confluent state. This particular switching occurs in close proximity to the pickup coil thereby providing an output pulse in response to the switch of state of the wire from reverse state to confluent state.

7 Claims, 6 Drawing Figures

U.S. Patent
Apr. 21, 1981
4,263,523
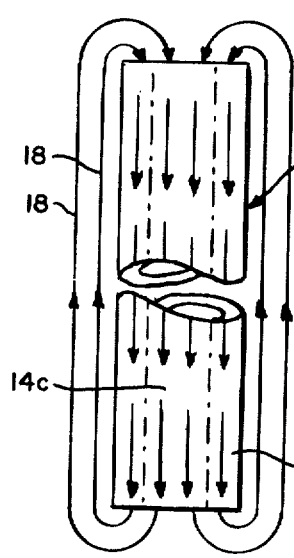
FIG. 1.
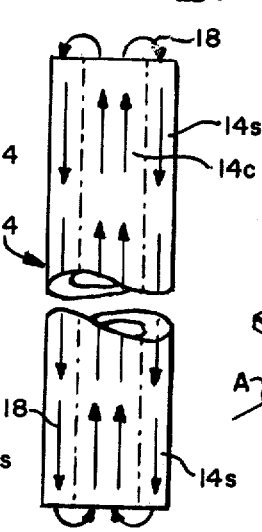
FIG. 2.
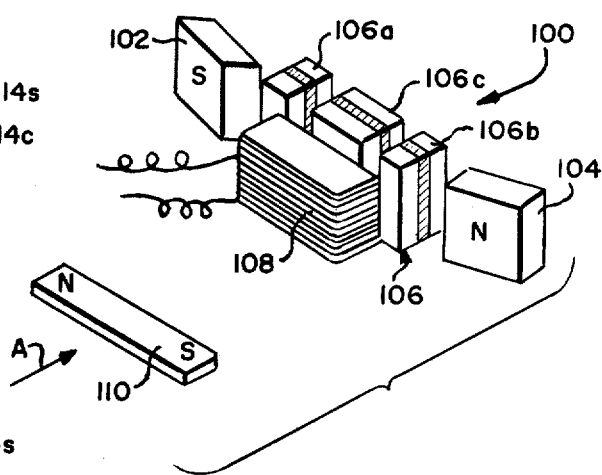
FIG. 3.
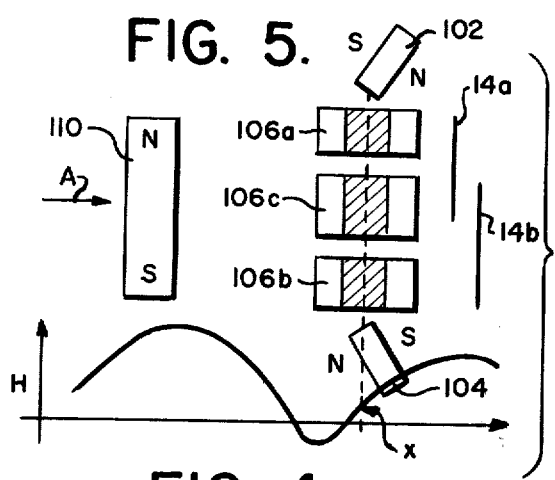
FIG. 5.
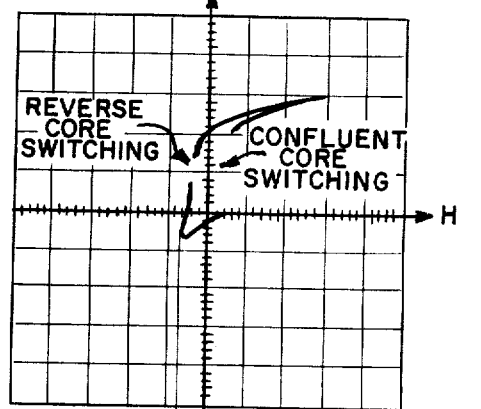
FIG. 6.
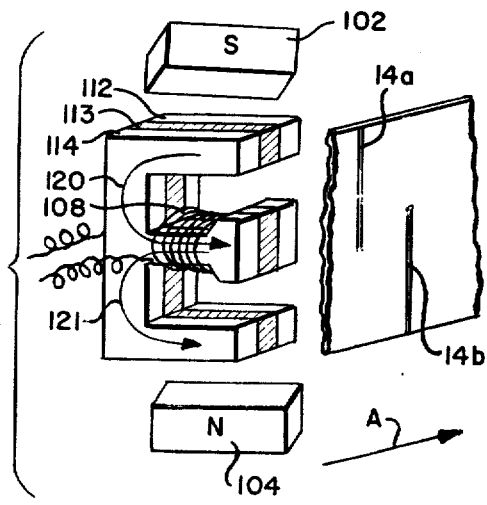
FIG. 4.
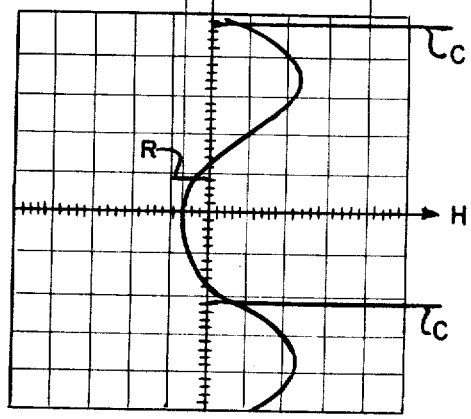

PULSE GENERATOR USING READ HEAD WITH WIEGAND WIRE

RELATED APPLICATIONS

This is a continuation-in-part of my pending application Ser. No. 897,483 filed Apr. 18, 1978 entitled "Switchable Magnetic Device and Method of Manufacturing Same" which in turn is a continuation-in-part of patent application Ser. No. 793,394 filed May 3, 1977, now abandoned.

BACKGROUND OF THE INVENTION

This invention relates in general to a pulse generator and more particularly to a pulse generator mechanism for generating a pulse in response to a switch in state of the magnetic wire disclosed in the above referenced patent application.

The magnetic device described in the above patent application is a ferro-magnetic wire having core and shell portions with divergent magnetic properties. These wires have come to be known in the art as Wiegand wires. One type of Wiegand wire is disclosed in U.S. Pat. No. 3,820,090. Another type of Wiegand wire is disclosed in the above referenced application.

The type of Wiegand wire of concern to the instant invention is one such that when the wire is subjected to a substantial magnetic field that is parallel to the axis of the wire, the entire wire will be magnetized in a first direction. As the external field is reduced in magnitude down to a zero field, the magnetization of the wire is unchanged. However, when the field reverses in direction, a small reverse field will cooperate with the shell to cause magnetization of the core to be reversed so that the flux generated by the shell will have its path completed through the relatively low reluctance core. The reversal in direction of the magnetization of the core can be sensed by a pickup coil to provide an output pulse.

When the direction of core magnetization and shell magnetization are opposite, the wire can be deemed to be in a reverse state. When core and shell magnetization are in the same direction, the state of the wire can be termed a confluent state.

As described in the referenced application, a preferred mode of switching this particular type of Wiegand wire is to first subject it to a sufficiently strong magnetization in a first or "positive" direction to force both core and shell into a confluent positive magnetization. The external field is then reduced in magnitude to zero and then beyond zero in a second or "negative" direction sufficiently to cause the core to change its direction of magnetization and thereby switch the state of the wire from confluent state to reverse state. After the reverse state has been achieved, then it is important that the magnitude of the external field in the second (i.e., negative) direction be limited and that the external field be reversed in direction again so as to go positive. The external field goes in a positive direction to a zero magnitude and then when the field becomes slightly positive, the state of the wire switches from its reverse state back to its confluent state. When the core changes its direction of magnetization during this switch of the wire from reverse state to confluent state, the change in the magnetization of the core is extremely rapid and the sensing core will provide a substantial output pulse in the order of a number of volts.

It is important that the external field have an asymmetric configuration in order to provide the maximum pulse when the wire switches from its reverse state to its confluent state. That is, it is important that the external field go strongly positive but not strongly negative. The external field must go negative enough to switch the state of the wire from its confluent state to its reverse state but not so strongly negative as to switch the shell.

Accordingly, an important purpose of this invention is to provide a pulse generating mechanism in which an external field is configured in a fashion that will provide the required asymmetric excitation so that the desired switching sequence is achieved. The desired switching sequence is determined by the fact that the greatest rate of change in flux occurs when the wire switches from its reverse state to its confluent state.

Accordingly, it is a purpose of this invention to provide a pulse generating mechanism that will operate on the particular type of Wiegand effect exhibiting wire described in the referenced patent application, to provide an appropriately configured field so as to provide a maximum output pulse in response to a switch in state of the wire.

It is a further purpose of this invention to provide this pulse generator in a package that is simple to use, relatively inexpensive and that will operate in a repeated and consistent fashion.

It is a related purpose of this invention to provide such a pulse generator device as will be useful in a wide variety of applications so that the pulse generator will be versatile.

BRIEF DESCRIPTION

In brief, the pulse generator of this invention incorporates a setting magnet having sufficient strength so that when brought into proximity with the Wiegand effect exhibiting wire, the setting magnet will serve to magnetize the wire in a predetermined direction. Spaced from the setting magnet are additional magnets and a pickup coil wrapped around a core.

As described in the referenced application, it is important that the external field to which the wire is subjected swing sufficiently "positive" to assure that the shell, as well as the core, is magnetized in a first direction (the confluent state). But this external field must swing sufficiently "negative" so as to aid in causing the core to switch its magnetization to establish a reverse state for the wire. Where the wire is moving across a field to achieve this switching result, it is important that the field be asymmetric. That is, it is important that the external field to which the wire is subjected be configured in a fashion that will (a) first provide a sufficiently strong positive field to assure the confluent state, (b) then provide a negative external field sufficient to switch the wire from its confluent state to its reverse state without switching the shell and (c) finally provide a positive field to assure that the wire will switch back from its reverse state to its confluent state. In this fashion although the core switches state, the shell will never switch state.

The additional magnets, the core and the setting magnet together provide a spatial magnetic field through which the wire moves. The field has a relatively large positive value near the setting magnet, a relatively small negative value downstream at a location near the additional magnets and a positive value at a location further downstream. The configuration of magnets and pickup coil are such as to cause the wire to switch from its reverse state to its confluent state directly under the core around which the pickup coil is positioned. Thus the rapid switch of state of the wire occurs with an optimum coupling of flux through the pickup coil. In this fashion a substantial output pulse is provided.

BRIEF DESCRIPTION OF THE DRAWINGS

FIG. 1 is a schematic representation of the Wiegand wire employed in this invention representing the nature of the flux flow when the wire is in its confluent state.

FIG. 2 is a schematic drawing similar to that of FIG. 1. representing the flux flow when the wire is in its reverse state.

FIG. 3 is a perspective view of the various active elements of a suitable read head for use in a pulse generator for providing output pulses when the Wiegand wire switches from its reverse state, shown in FIG. 2, to its confluent state, shown in FIG. 1. In FIG. 3, for clarity, none of the support structure is shown.

FIG. 4 is a diagrammatic view in perspective of the FIG. 3 read head showing the relationship of two successive wires being passed over the face of the read head.

FIG. 5 is a magnetic schematic plan view along the face of the read head shown in FIGS. 3 and 4 illustrating the various polarities that are adjacent to the wire as the wire passes over the face of the read head. FIG. 5 includes an idealized curve showing the field strength and polarity along the face of the read head in the direction of travel of the wire across the read head.

FIG. 6 is a graphical illustration of the hysteresis loop of the wire as it passes over the face of the read head as it is subjected to the asymetric field shown in FIG. 5. The field representation shown in FIG. 5 is repeated in FIG. 6 below the hysteresis curve to aid in visualizing the sequence involved.

DESCRIPTION OF THE PREFERRED EMBODIMENTS

The pulse generator of this invention employs the read head that is shown in FIGS. 3, 4 and 5 in order to set the state and respond to the change of state of the Wiegand wire which is schematically illustrated in FIGS. 1 and 2. This wire 14 has two magnetic states which are illustrated in FIGS. 1 and 2. The manner in which the wire 14 is manufactured as well as a more detailed discussion of the nature of these two states may be found in the application Ser. No. 897,483 referred to above supplemented by U.S. Pat. No. 3,820,090 issued June 25, 1974 to John R. Wiegand. The preferred form of the wire 14 for use in this pulse generator is disclosed in the referenced patent application, Ser. No. 897,483.

The magnetic field configuration shown in FIGS. 5 and 6 and the following description assumes that the preferred wire is employed. For present purposes, it should be noted that when the wire 14 is subjected to a substantial external field (for example, 100 Oersteds) the entire wire will be magnetized in a direction dictated by the field. FIG. 1 represents this magnetic state in which the flux lines 18 are completed in the air outside of the magnetized wire 14. From the point of view of the polarization and flux arrangement this is quite similar to the arrangement of a bar magnet. This state is called herein the confluent state.

When the wire in the confluent state is subjected to a relatively weak field (for example 20 Oersteds) in the opposite direction, the wire will switch to the reverse state shown in FIG. 2. In the reverse state, the flux path is substantially completed through the core of the wire. The change of state of the wire is essentially a change of direction of the flux through the core.

FIGS. 3, 4 and 5 illustrate the read head 100 of this invention. An understanding of the operation of the read head 100 will aid the user to optimize the dimensions of a particular read head for a particular application.

The read head 100 includes first and second magnets 102 and 104, a laminated E-shaped core 106 and a pickup coil 108 that is wrapped around the center leg 106c of the laminated E-shaped core 106. In addition, a setting magnet 110 spaced from the core 106 and magnets 102, 104 serves the function of assuring that the wire 14 is set to a predetermined polarity before it is subjected to the field under the core 106 and coil 108.

In FIGS. 3, 4 and 5 the arrow marked "A" illustrates the direction of travel of the wire. The wire 14 first passes under the setting magnet 110 thereby assuring that it has a given polarity and is in the FIG. 1 confluent state. The wire then passes under the face of the E-shaped core 106 at which time the wire switches state inducing a pulse in the pickup coil 108.

Before analyzing what happens under the face of the core 106, it should be noted that the core 106 is composed of three E-shaped laminae 112, 113 and 114. The outer laminae 112 and 114 are a soft magnetic material such as soft iron that is readily magnetized in the presence of the magnets 102 and 104. The center lamina 113 is magnetically inert and thus may be plastic or aluminum. The two magnets 102 and 104 generate the field which cause the wire 14 to switch state. However, the configuration of this field is determined by the polarity and angling of these two magnets 102 and 104 as well as by the existence and configuration of the E-shaped core 106. The result is that the magnetic field seen by the wire 14 as it travels across the read head 100 has approximately the configuration shown in FIGS. 5 and 6.

The FIG. 5 illustration is not to scale. It is an idealized illustration of the field polarity and strength along the "A" direction. FIG. 5 shows a field having the asymmetric polarity and magnitude necessary to cause the wire 14 to switch state at a location on the center axis of the face of the E-core 106. It is desirable to switch the wire 14 at the center axis of the core 106 in order to assure that a maximum amount of the flux change generated by the wire 14 is coupled through the pickup coil 108 when the wire 14 switches state.

When the wire 14 does switch state, the amount of flux coupled through the center leg 106c of the core changes and this change in flux is sensed by the pickup coil 108 to provide an output pulse.

As the wire 14 travels to the right in FIG. 5 and leaves the influence of the setting magnet 110, it maintains the FIG. 1 confluent state set by the magnet 110. However, as the field goes slightly negative near the E-core 106, the wire 14 will switch into its reverse state (the state shown in FIG. 2). In this reverse state, a relatively magnetically hard shell portion 14s of the wire captures and reverses the polarity of the relatively magnetically soft core portion 14c. Accordingly, the flux 18 generated by the relatively hard shell portion 14s is coupled through the relatively soft core portion 14c and the flux pattern changes from that shown in FIG. 1 to that shown in FIG. 2. A discussion of the relatively hard shell portion 14s and the magnetically soft core portion 14c may be found in the referenced patent application and referenced U.S. Pat. No. 3,820,090.

As the wire continues to move under the read head 100, the slightly negative field becomes positive and at a point approximately along the central axis of the E-core 106, the field becomes sufficiently positive so as to cause the wire 14 to switch back into its confluent state (the state shown in FIG. 1). This change in the magnetic state of the wire causes the flux 18 generated by the shell portion 14s that was coupled through the core 14c to complete its path outside of the wire 14. Because of the presence of the soft iron and therefore low reluctance paths through the outer laminae 112 and 114 of the E-core 106, this flux 18 will be coupled through the E-core 106.

As shown in FIG. 4, wire segments 14a and 14b can be axially displaced relative to each other to span different portions of the face of the read head. The following discussion arbitrarily refers to upper and lower to provide convenient correspondence to the way in which items are shown in FIG. 4. The upper wire segment 14a spans the gap between the upper leg 106a and the center leg 106c. The lower segment 14b spans the gap between the lower leg 106b and the center leg 106c. When an upper wire segment 14a switches from its reverse state (FIG. 2) to its confluent state (FIG. 1), then the flux 118 will complete a path through the upper leg 106a and the center leg 106c in the direction shown by the curved arrow line 120. Accordingly, the change in flux through the pickup coil 108 will be in a first direction and will induce an output pulse of a first polarity. When the lower wire segment 14b switches from its reverse state to its confluent state under the E-core 106, then the flux will complete a path through the lower leg 106b and the center leg 106c in the direction shown by the curved arrow line 121. In this case, the change in flux 18 through the pickup coil 108 will be in a second direction opposite from the first direction and thus will induce an output pulse of a second polarity.

In this fashion, each upper wire segment 14a will produce an output pulse of a first polarity and each lower wire segment 14b will produce an output pulse of a second polarity thereby providing a technique for coding a sequence of wires 14.

As indicated in the referenced application and referenced patent, the change in state of the wire 14 is very rapid. When employing the preferred embodiment of the wire disclosed in the referenced patent application, this change of state is particularly rapid when switching from the reverse state (FIG. 2) to the confluent state (FIG. 1). Thus the rate of change of flux with time is very great. As a consequence the output pulse is appreciable and can be readily read by downstream electronic equipment.

It has been found preferable to use the particular Wiegand effect exhibiting wire which is disclosed in the referenced application Ser. No. 897,483. In general, the Wiegand effect exhibiting wire disclosed therein is a vanadium-cobalt-iron wire which has been processed in a fashion disclosed in the application. This particular wire has been found to give a large peak when switched from its reverse state to its confluent state after being subjected to an asymmetric field of the type shown in FIGS. 5 and 6.

The hysteresis loop for the wire 14 when asymmetrically excited as described above is shown by the curve in FIG. 6. FIG. 6 is illustrated in substantially the form it would appear on an oscilliscope. The breaks (Wiegand jumps) in the curve that are labeled "Reverse Core Switching" and "Confluent Core Switching" appear on the oscilliscope as only a faint trace because the rate of change of flux (or magnetization B) through the core 14c is very rapid as the strength of the external field H passes through the corresponding threshold value. The larger gap in the curve 34 is labeled "Confluent Core Switching." This condition occurs when the external applied longitudinal magnetic field H switches longitudinal magnetization of the core from the FIG. 2 reverse state to the FIG. 1 confluent state. During "Reverse Core Switching," the core is switched by the magnetic field H from the confluent state into the reverse state. As indicated in FIG. 6, the pulse C induced in the coil 108 when swtiching from the reverse state to confluent state is much greater than the pulse R induced when switching from confluent state to reverse state.

A particular embodiment of this invention has been described. However given the above disclosure, there are other embodiments that could be devised within the skill of those in the art. For example, the spatial arrangement disclosed presumes a plane. The structure could be set up along a cylindrical surface so that a series of repetitive pulses could be generated through the use of a single wire element 14. In any such embodiment, the setting magnet 110 might be positioned where it will more significantly affect the confluent core switching position X than is the case in the planar embodiment illustrated in the FIGS. herein.

What is claimed is:

1. A pulse generator comprising:
   a Wiegand wire having core and shell portions and having the characteristic that it requires the aid of an external field to switch from its confluent state to its reverse state,
   read head means to establish a predetermined magnetic field along a predetermined path, the magnitude and direction of said magnetic field varying along said path,
   motive means to create relative movement of said head and said wire so that said wire travels along said path from a first position on said path to a final position along said path, said magnetic field having at least a first magnitude in a first direction at said first position, said first magnitude being sufficiently great to set the magnetization of both said core and said shell in a predetermined first confluent state,
   said field having a second magnitude in a second direction at a second position downstream from said first position along said path, the absolute value of said second magnitude being substantially less than the absolute value of said first magnitude, said second magnitude being sufficient to switch the magnetization of said core thereby switching the state of said wire from said first confluent state to said reverse state, said second magnitude being insufficient to set the magnetizatin of said shell,
   said field having a third magnitude in said first direction at a third position downstream from said second position, said third magnitude being sufficient to switch the magnetization of said core thereby switching said wire from said reverse state to said first confluent state at said third position, and
   a pickup coil positioned adjacent to said third position to provide an output pulse in response to the switch of state of said wire from said reverse state to said first confluent state.

2. The pulse generator of claim 1 wherein said read head means comprises:
   a setting magnet at said first position, an E-core at said third position, the face of said E-core being adjacent to the path of said wire at said third position, said pickup coil being wound on the center leg of said E-core, first and second field configuring magnets positioned outboard of said E-core at said third position, the upstream facing poles of said field configurating magnets providing a magnetic field polarity across said path opposite in direction to the magnetic field polarity across said path of said setting magnet.

3. The pulse generator of claim 2 wherein:

said E-core is composed of first, second and third laminaes, said first and third laminaes being outer laminae of a soft magnetic material, said second lamina being sandwiched between said first and third laminae and being composed of a nonmagnetic material.

4. A pulse generator comprising:

a Wiegand type wire having core and shell magnetic portions, said core portion having a coercivity sufficiently great so that when the wire is in its confluent state the magnetization of the shell portion is inadequate to switch the wire into a reverse state, magnetic field establishing means to establish a magnet field across a portion of a path of travel of said wire, said magnetic field varying in magnitude and direction as a function of position along said portion of said path of travel, said magnetic field having at least a first predetermined magnitude in a first direction at a first predetermined position, said magnetic field having a second magnitude in a second direction opposite from said first direction at a second position along said path downstream from said first position, said first magnitude being sufficiently great to set the direction of magnetization of said shell as well as of said core thereby establishing a first confluent state of said wire, said second magnitude being substantially less that said first magnitude and being sufficient to set the magnetization of said core and insufficient to set the magnetization of said shell to switch said wire from said first confluent state to a first reverse state, said field having a third magnitude in said first direction at a third position downstream from said second position, said third magnitude being substantially less than said first magnitude and being sufficient to assure switching of said core at said third position thereby switching said wire from said first reverse state to said first confluent state at said third position, and a pick-up coil at said third position to provide an output pulse in response to the switch of state of said wire at said third position.

5. A read head for use with a Wiegand wire having the characteristic that it requires the aid of an external field to switch from its confluent state to its reverse state, comprising:

a magnetic circuit to establish a predetermined magnetic field along a predetermined path, the magnitude and direction of said magnetic field varying along said path, said magnetic field having at least a first predetermined magnitude in a first direction at a first position along said path, said first predetermined magnitude being sufficiently great to set the magnetization of said wire to be passed along said path in a predetermined first confluent state, said field having a second magnitude in a second direction at a second position spaced from said first position along said path, the absolute value of said second magnitude being substantially less than the absolute value of said first magnitude, said second magnitude being sufficient to switch the magnetization of the core of said wire thereby switching the state of said wire from said first confluent state to said reverse state, said second magnitude being insufficient to set the magnetization of the shell of said wire, said field having a third value in said first direction at a third position downstream from said second position, said third magnitude being sufficient to switch the magnetization of said core thereby switching said wire from said reverse state to said first confluent state at said third position, and a pickup coil positioned adjacent to said third position to provide an output pulse in response to the switch of state of said wire from said reverse state to said first confluent state.

6. The read head of claim 5 wherein said magnetic circuit comprises:

a setting magnet at said first position, an E-core at said third position, the face of said E-core being adjacent to the path of said wire at said third position, said pickup coil being wound on the center leg of said E-core, first and second field configuring magnets positioned outboard of said E-core at said third position, the upstream facing poles of said first and second field configuring magnets providing a magnetic field polarity across said path opposite in direction to the magnetic field polarity across said path of said setting magnet.

7. The read head of claim 6 wherein:

said E-core is composed of first, second and third laminaes, said first and third laminaes being outer laminae of a soft magnetic material, said second lamina being sandwiched between said first and third laminae and being composed of a non-magnetic material.

* * * * *